United States Patent [19]

Gregory et al.

[11] Patent Number: 5,337,279
[45] Date of Patent: Aug. 9, 1994

[54] SCREENING PROCESSES FOR FERROELECTRIC MEMORY DEVICES

[75] Inventors: Anne K. Gregory; Michael P. Brassington, both of Sunnyvale; Shi-Qing Wang, Campbell; Norman E. Abt, Burlingame, all of Calif.

[73] Assignee: National Semiconductor Corporation, Santa Clara, Calif.

[21] Appl. No.: 861,212

[22] Filed: Mar. 31, 1992

[51] Int. Cl.$^5$ .................... G11C 7/00; G11C 11/22
[52] U.S. Cl. .................... 365/201; 365/145; 257/295; 324/158.1
[58] Field of Search .............. 365/117, 145, 149, 201; 257/295; 324/158 R, 158 T, 659, 718

[56] References Cited

U.S. PATENT DOCUMENTS

| 3,531,779 | 9/1970 | Hopkins et al. | 365/145 |
| 4,086,124 | 4/1978 | Peuzin et al. | 365/117 X |
| 4,731,754 | 3/1988 | Ogden et al. | 365/117 X |

OTHER PUBLICATIONS

Fridkin, *Ferroelectric Semiconductors*, Consultants Bureau, N.Y., pp. 1-21, 23-39, 41-79 and 209-227, 1980.

*Primary Examiner*—Joseph A. Popek
*Attorney, Agent, or Firm*—Townsend and Townsend

[57] ABSTRACT

A screening process for ferroelectric memory devices that provides a greater degree of confidence in the mechanical and thermal stability of the ferroelectric material than prior art screening processes. A correspondingly higher degree of confidence in the reliability of the screened part results.

25 Claims, 7 Drawing Sheets

SCREENING PROCESSES FOR FERROELECTRIC MEMORY DEVICES

BACKGROUND OF THE INVENTION

This invention relates to ferroelectric memory devices and more particularly to screening processes for ferroelectric memories. The term ferroelectric is used to describe both a type of behavior and the group of substances exhibiting that behavior. Most solids undergo a rearrangement of electrical charge when a voltage is placed across the material. All the positive charges effectively shift slightly in one direction and the negative charges in the other. In ordinary materials, the charges will "relax" back to their original places when the voltage is removed. Ferroelectrics make up a special group of materials which can maintain the charge separation, or dipole, without an applied voltage. Furthermore, this dipole arrangement can be reversed by applying an electric field.

To better illustrate the properties of ferroelectrics, the unit cell of the ferroelectric barium titanate ($BaTiO_3$) serves as an example. A unit cell is a geometric figure illustrating how the grouping of atoms which make up a solid are arranged relative to each other. The unit cell structure for a given solid is repeated throughout that solid.

The unit cell 4 for barium titanate shown in FIG. 1A has a cube structure. A barium ($Ba^{2+}$) atom 6 is located at each of the eight corners of the cube. At the center of each cube face, is located an oxygen atom ($O^{2-}$) 8. The radius of the six oxygen atoms project in toward the center of the cube leaving a octahedral space in the interior of the cube. In the approximate center of the unit cell, is located the titanium atom ($Ti^{4+}$) 10.

When the barium titanate is heated above its Curie temperature of 120° C., the unit cell is cubic and axes 12 shown by the dashed lines are of equal length. The Ti ion fits within the octahedral space and is centered within the cube as seen in FIG. 1A. However, when the barium titanate is cooled below 120° C., the unit cell contracts. This Ti ion is now slightly larger than the octahedral space created by the oxygen ions. As a result, the Ti ion shifts to one side or the other of center within the interior space of the cube. The Ti ion can move in any of the six directions shown: vertically along axis 12z, horizontally along axis 12x, or in and out along axis 12y. In FIG. 1B, the Ti ion is located slightly below center and in FIG. 1C the Ti ion is located slightly above center.

The titanium ion has a plus four positive charge. Therefore, when the Ti ion is located slightly above center as in FIG. 1B, the top half of the cell is slightly positively charged when compared to the bottom half of the cell, a dipole is formed. The structure of FIG. 1B has a dipole of opposite polarity to that of FIG. 1A. Unit cells having dipoles aligned in a common direction are called domain. The $BaTiO_3$ material of this example thus has six randomly possible domains.

FIG. 2 shows how these randomly oriented dipoles can be aligned in a common direction by applying an electrical force. Assume a crystal of barium titanate containing an equal number of positive and negative domains. Upon increasing the field (E) in the positive direction, the positive domains grow at the expense of the negative domains. The polarization (P) increases sharply (see OA) and reaches a saturation value (BC) when all of the domains are aligned in the direction of the field. The crystal now has a "single domain" structure. When the field E is again reduced to zero, a few domains remain aligned. At zero field in a definite value of polarization can be measured, and this is called the remanent polarization $P_r$ (OD). To reverse the remanent polarization, it is necessary to apply an electric field in the opposite (negative) direction. The field required for this purpose is called the coercive field, $E_c$ (OF). With further increase of field in the negative direction, uniform alignment of the dipoles again is reached, but this time in the direction opposite to the previous one (GH).

The polarization properties of ferroelectrics as represented by the hysteresis loop of FIG. 2 make ferroelectric films useful in the construction of certain nonvolatile memory devices. FIG. 3 shows such a ferroelectric memory device in cross section. The memory device shows a single memory cell in which a ferroelectric material 40 is located between a top electrode 42 and a bottom electrode 44, forming a capacitor. In the device of FIG. 3 the ferroelectric comprises lead zirconate titanate (PZT) but other ferroelectrics may be used. Ferroelectric 40 has been polarized to either a first (positive) polarity or second (negative) polarity depending upon the desired contents of the memory cell. When the cell had previously been polarized to a positive polarity, and the drive line 46 is pulsed high, a small displacement current flows and the bitline is pulled up to a small voltage and the cell reads a binary "zero". When the cell had been previously polarized to a negative polarity and the drive line 46 is pulsed high, a large displacement current flows and the bitline is pulled up to a higher voltage and the cell reads a binary "one". The difference in voltage is used to indicate a binary one or binary zero. Note that the polarity of the cell may be changed by the read process. Therefore, like a DRAM cell, the memory cell must be rewritten once it is read.

In the example immediately above, for the cell storing a binary one to be reliably read, the bitline voltage generated by the cell must be sufficiently greater than that expected from a cell storing a binary zero to distinguish the two states. The magnitude of the bitline voltage is a direct function on the magnitude of the remanent polarization.

To ensure the reliability of memory devices manufactured using ferroelectric materials, the devices are put through a preshipment screening procedure. Those devices having material and electrical defects are thereby discarded before shipping. Parts remaining after completion of screening procedures are then qualified for use for a given number of read cycles and a given maximum operating operating temperature.

SUMMARY OF THE INVENTION

The present invention provides a novel test method for quality control and reliability screening of ferroelectric devices. The method of the present invention qualifies the tested devices for use in higher operating temperature environments and with a greater degree of confidence than the prior art testing process.

The present invention recognizes that the prior art testing procedures fail to adequately characterize the properties of the ferroelectric material and are instead based upon characterizing the test process itself.

DESCRIPTION OF THE PREFERRED EMBODIMENTS

Figure 5:
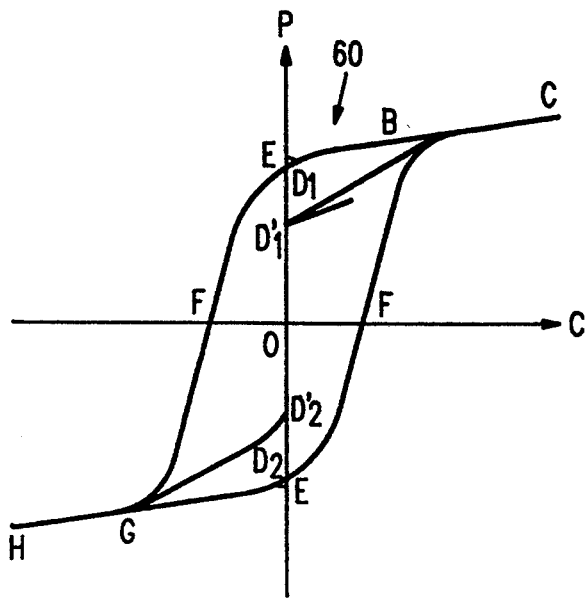
FIG. 5 is a graph of a contracted ferroelectric hysteresis.

As discussed above, the failure of a ferroelectric memory cell relates to the cell's inability to retain sufficient remanent polarization for proper operation of the device. FIG. 5 illustrates this principle. In FIG. 5, the strength of the bitline signal is proportional to the magnitude of the difference in polarization between D1 and D2. If the gap between D1 and D2 becomes too small, then a bitline signal too weak to separate one from zero will be generated when the device is read.

Several environmental factors combine to contract the hysteresis loop during the life of the part. These factors include ageing of the material, electrical cycling of the material from repeated read and write cycles, and exposure to thermal stress. These factors cause the hysteresis loop 60 to contract such that the upper boundaries of the loop are located at points D1' and D2'. If loop 60 contracts too much, Di' and D2' will not be sufficiently separated to ensure proper operation of the ferroelectric device.

Figure 6:
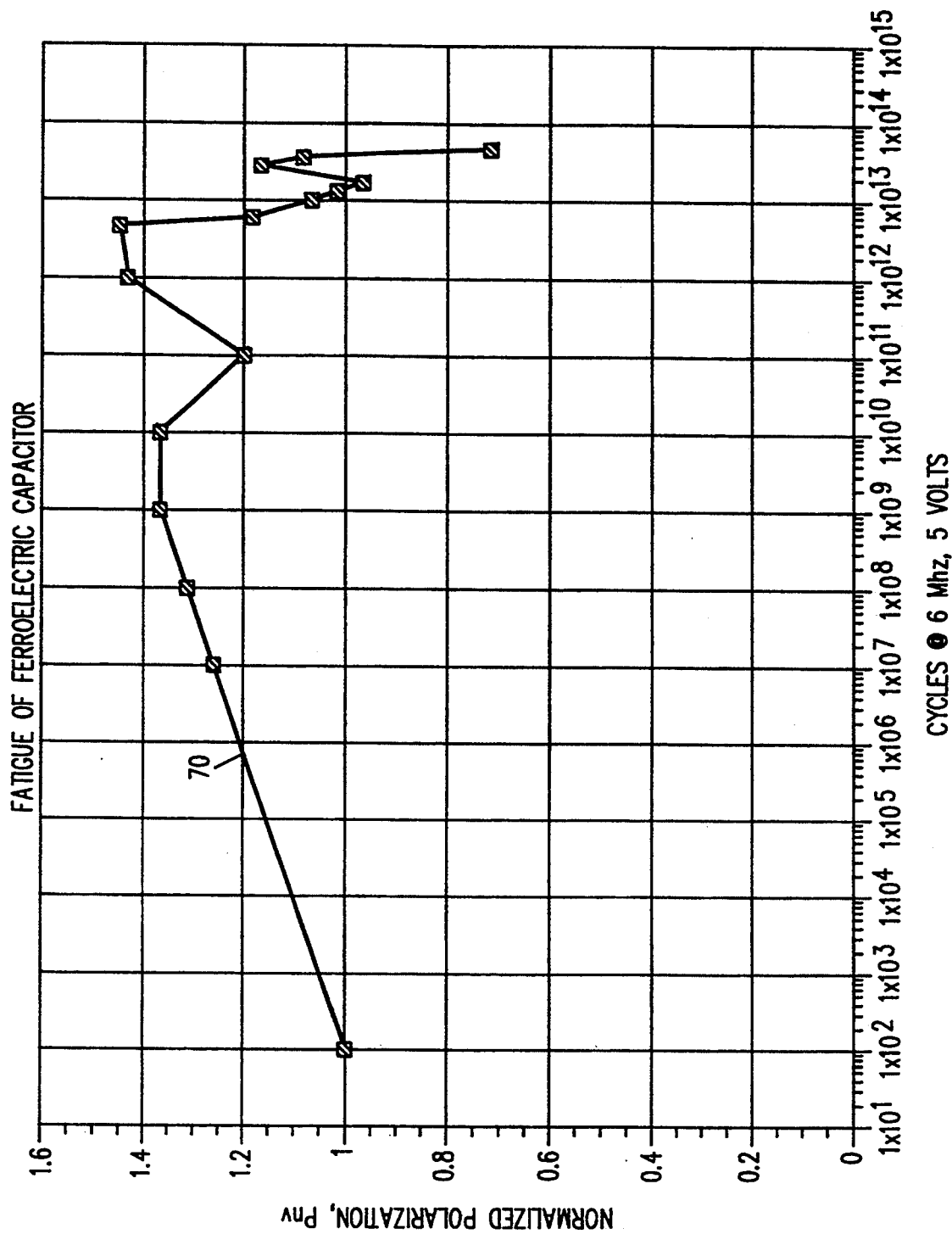
FIG. 6 is a graph of remanent polarization as a function of read/write cycles.
Figure 7:
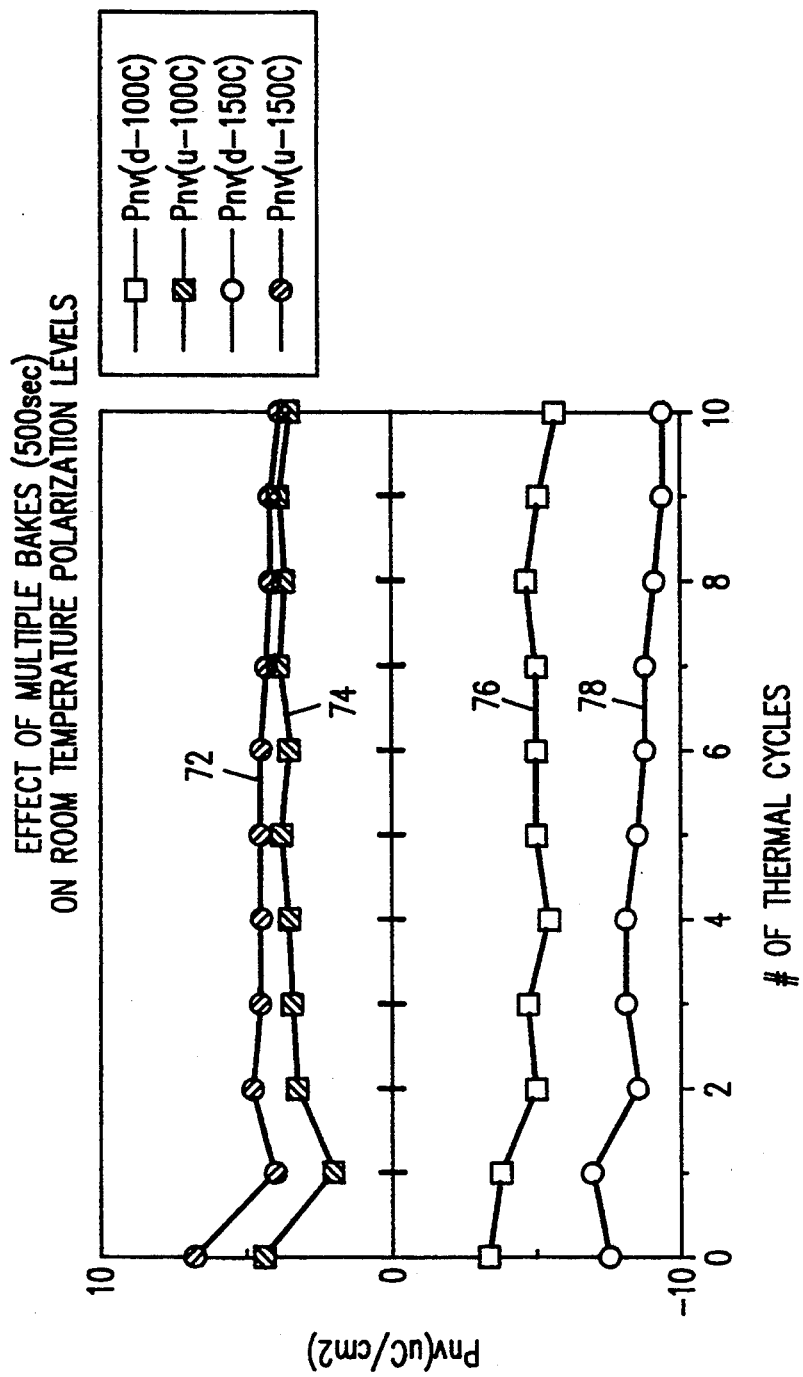
FIG. 7 is a graph of room temperature polarization levels as a function of thermal cycles.

Hysteresis 60 does not steadily contract. When exposed to electrical and thermal cycling, hysteresis 60 contracts for a few cycles and then reaches a stable position. FIG. 6 is a graph of polarization vs. cycles of use, in which curve 70 shows the impact of electrical cycling on remanent polarization. FIG. 7 shows a graph of room temperature remanent polarization as a function of thermal cycles. Curves 72 and 74 represent a positive polarity and curves 76 and 78 diagram the effect of thermal cycling on negative polarity. When the number of thermal cycles is kept low, the room temperature polarization has an initially high value. As the number of thermal cycles increases, the magnitude of the remanent polarization steadily decreases until a stabilized value is attained. FIG. 7 shows that thermal stabilization can be achieved within between three to six cycles and occasionally in as little as two cycles.

Figure 4:
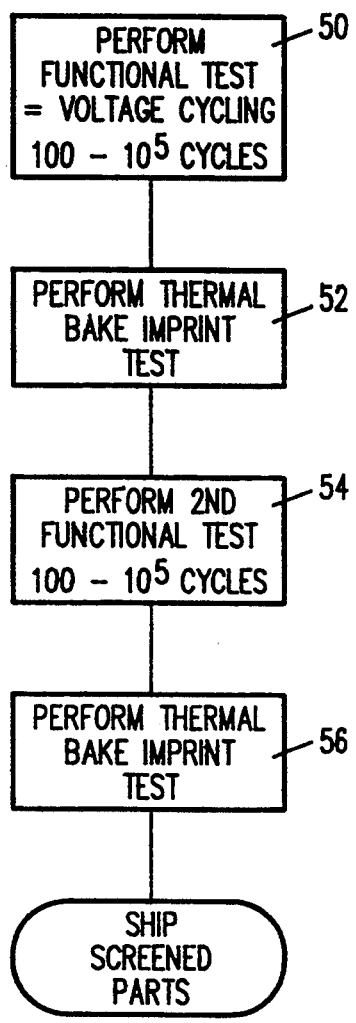
FIG. 4 is a flow chart of a screening procedure according to an embodiment of the present invention.

FIG. 4 contains a flow chart of a screening procedure used to screen ferroelectric memory devices prior to shipment. In step 50, the ferroelectric memory device undergoes a functional test. In the functional test, the device is poled by applying a five volt signal to each of the device capacitors. The capacitors are then all of a given polarity. A signal of negative five volts is then applied to each of the device capacitors to reverse the polarity. This process is repeated for a total of approximately 100 to $10^5$ cycles depending upon the part size. Larger devices take more time to pole and therefore the number of poling cycles in the functional test is typically less than for smaller devices.

In step 52, the device is thermally baked. In this screening step, the memory array is written with an alternating pattern of ones and zeros. The memory device is then "baked" at an elevated temperature slightly higher than the desired operating temperature. Typically, the temperature is 80° C. for a 70° C. operating temperature. Some of the device cells fail as a result of this procedure. The cells do not retain sufficient polarization to distinguish between a one and a zero. Alternately, the cells do not maintain a sufficient polarization of the proper orientation. Devices with failed cells are discarded.

Steps 54 and 56 repeat steps 50 and 52 described above except the alternating pattern has been reversed. Failed cells return to the state they were in at bake step 52. This phenomenon is called imprinting. At the end of this screening process the remaining parts are sold as parts qualified for operation up to a given operating temperature and for a given number of cycles of use. In the example above and for the memory shown in FIG. 3, the memory would be sold for operation in 70° C. operating environments and read/write cycles.

In the screening procedures of FIG. 4 described above, two bakes of extended duration were performed on the part. The part was tested for proper performance after each bake. For any given polarization state, the device underwent only one thermal cycle. Because only two thermal cycles of the part is included in this screening procedure, the ferroelectric hysteresis may not be thermally stabilized. Thus, a statistical possibility remains that even a cell/s surviving the FIG. 4 screening process may have a further contraction of the hysteresis during subsequent normal operations of the device. This contraction may reduce the ramanent polarization such that the screened device fails in the field.

The present invention recognizes the desirability of stabilizing the ferroelectric material and associated hysteresis. Mechanical stabilization is achieved by the application of voltage cycling to create a switchable domain structure within the ferroelectric material. Thermal stabilization is achieved by subjecting the device to repeated exposures to elevated temperatures to relax the internal strains caused by the electrically induced domain structures.

Figure 8:
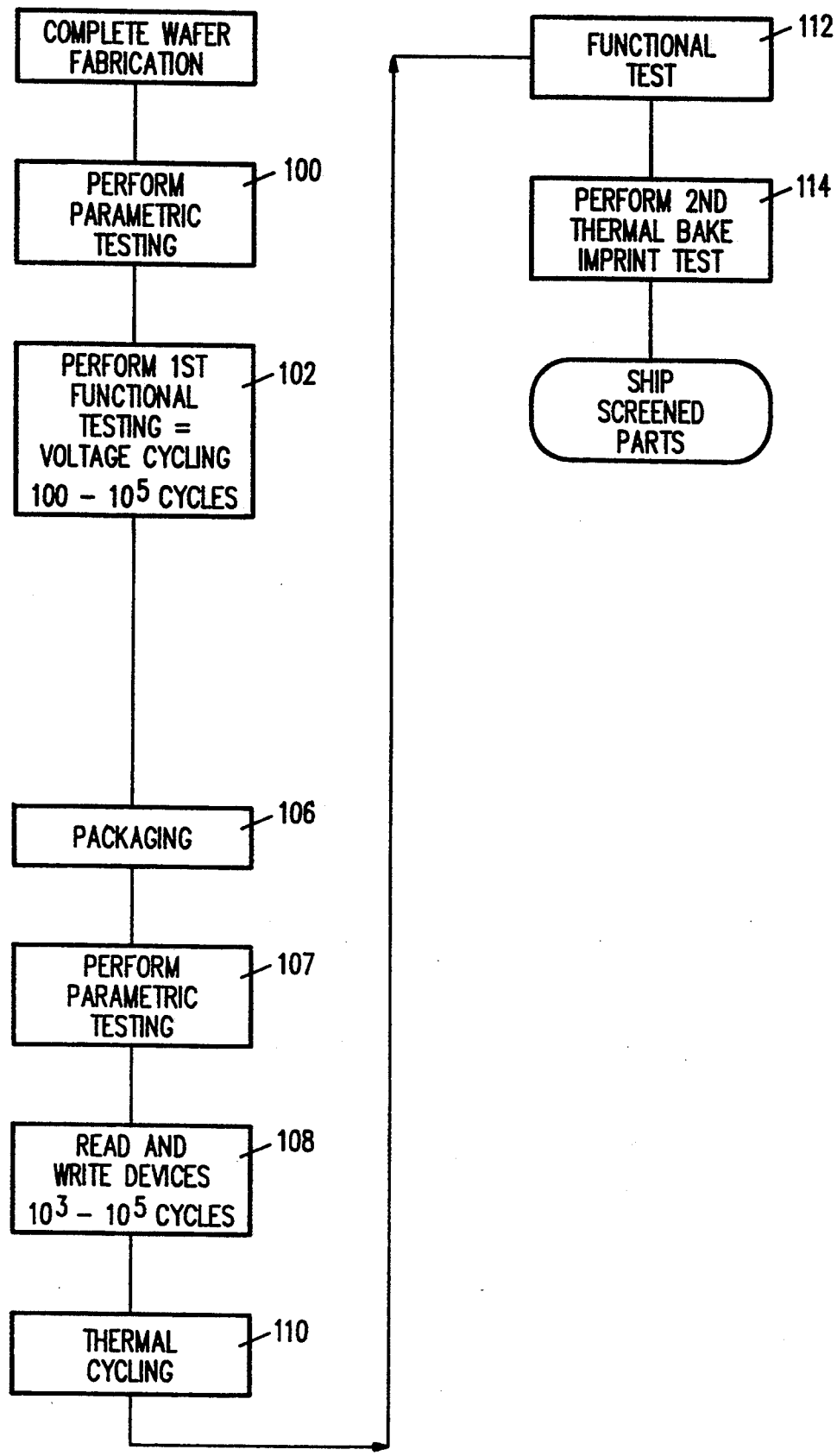
FIG. 8 is a flow chart of a screening process according to an embodiment of the present invention.

FIG. 8 is a flow chart of the screening process of the present invention. In step 100 after wafer fabrication is complete, parametric testing is performed. Parametric testing applies a voltage across the device capacitors to make an initial determination that the ferroelectric devices' remanent polarization is within the limits necessary for proper operation of the device. Parametric testing is performed using techniques well known to those of skill in the art.

In step 102, CMOS functional testing is performed. For CMOS functional testing, a first positive voltage, for example plus five volts, is applied to the cells to pole the material in a first direction. A signal of negative five volts is then applied to each of the device capacitors to reverse the polarity. This process is repeated for a total of approximately 100 to $10^5$ cycles depending upon the part size. Larger devices take more time to pole and therefore the number of poling cycles is typically less than for smaller devices.

Devices which survive step 102 of the screening process are then packaged in step 106 using techniques known to those of ordinary skill in the art. The temperatures used in the packaging process will typically take the material through its Curie point. As a result, the polarization states of the memory cells after packaging will be random.

After packaging, the device undergoes a second parametric test 107 and second read/write test in step 108 identical to that performed in step 102.

In step 110, the thermal cycling of the device takes place. The devices are written with a particular pattern, for example, ones and zeros at the end of the functional test. The device is subjected to at least two thermal cycles composed of elevating the temperature of the part for a period of 500–600 seconds then allowing the part to cool to room temperature. The dwell time at temperature however is not important. Stabilization of the ferroelectric can usually be achieved in less than six cycles. No testing of the part is necessary between cycles.

The elevated temperature chosen depends upon the material used and the desired operating temperature of the device. The elevated temperature must be less than the Curie temperature of the ferroelectric material and preferably be ten to twenty five degrees above the desired maximum operating temperature of the part.

Figure 1A:
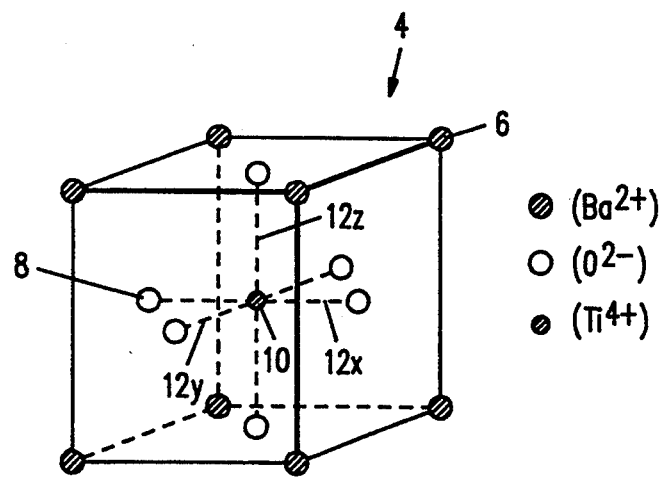
FIG. 1A is an isometric drawing of a barium titanate unit cell.
Figure 1B:
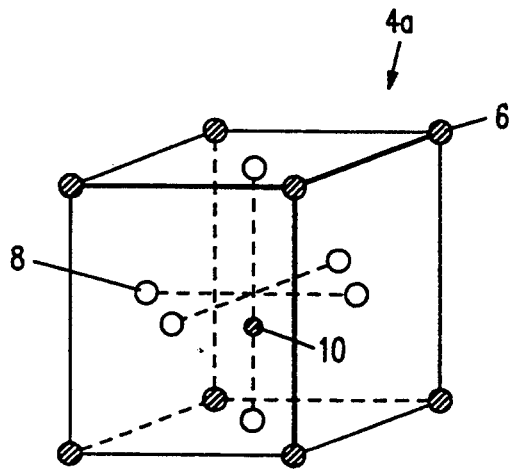
FIG. 1B is a cross section of a barium titanate unit cell having a first domain.
Figure 1C:
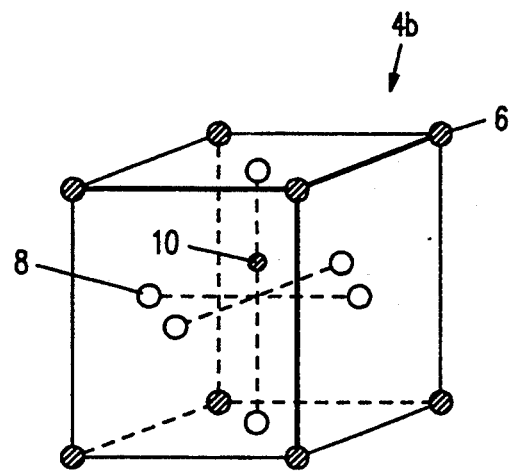
FIG. 1C is a cross section of a barium titanate unit cell having a second domain.
Figure 2:
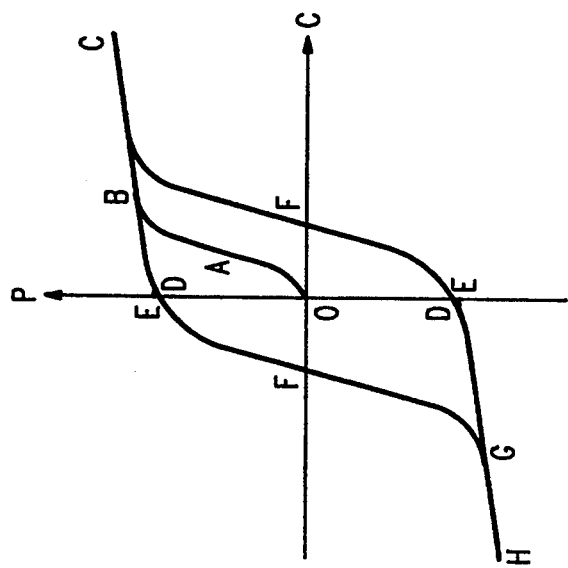
FIG. 2 is a characteristic ferroelectric hysteresis.
Figure 3:
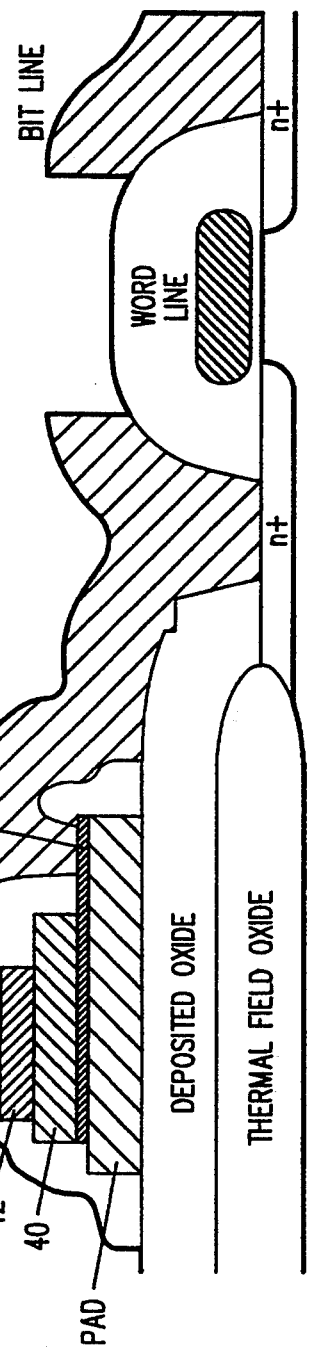
FIG. 3 is a cross sectional view of a ferroelectric semiconductor memory device.

For example, in PZT ferroelectric memory devices such as the one shown in FIG. 3, three thermal cycles of 600 seconds at 80° C. results in screened parts qualified for use with 70° C. maximum operating temperatures. The maximum operating temperature also includes the maximum storage temperature. Similarly, three thermal cycles of 500 seconds at 150° C. results in screened parts qualified for use in 125° C. environments.

Figure 9:
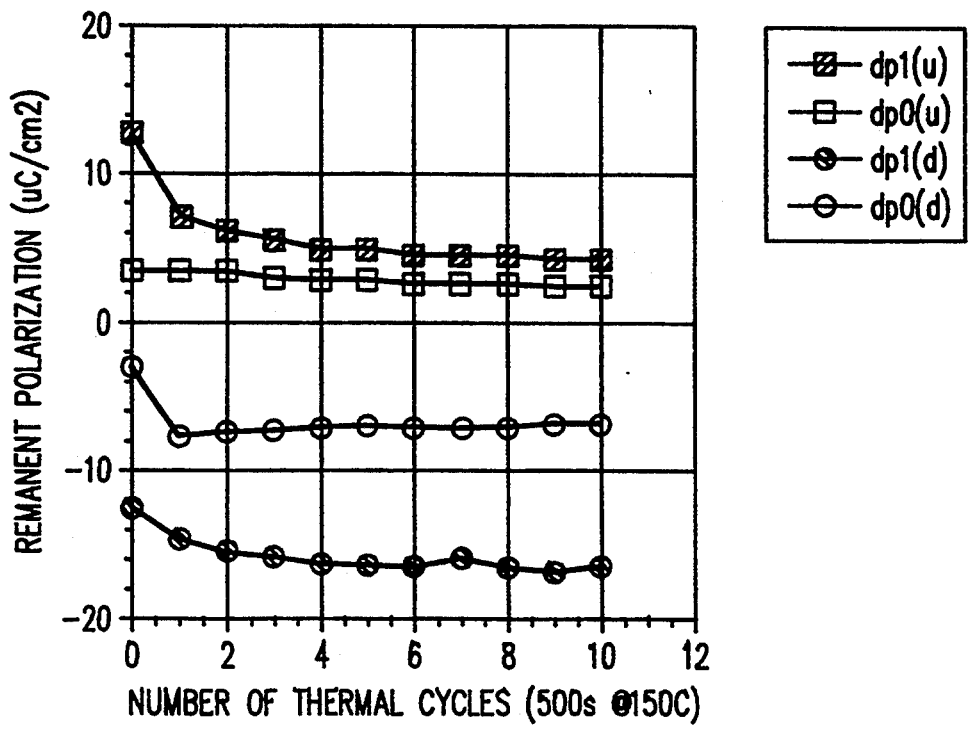
FIG. 9 is a graph of remanent polarization as a function thermal cycles for various temperatures.
Figure 9:
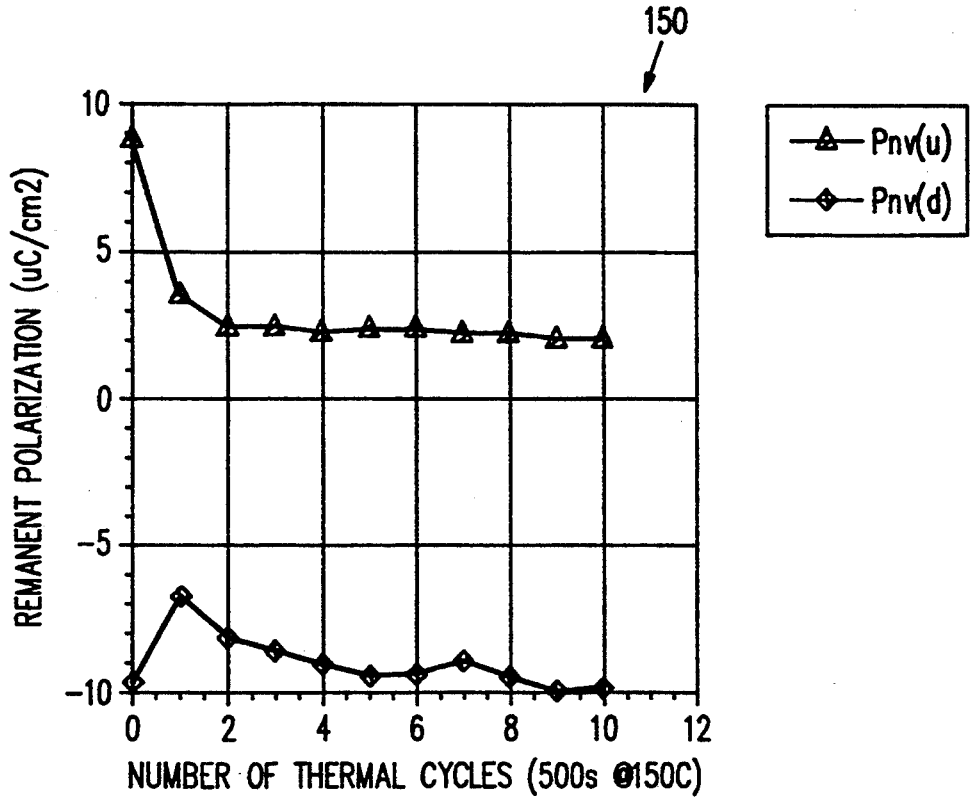

FIG. 9 contains a graph of the thermal cycle process, showing stabilization of the ferroelectric for 70° C. cycles and for 150° C. cycles. The lower graph 150 of FIG. 9 shows the normalized polarization Pnv. Normalized polarization is equivalent to the polarization observed during read of a binary one (dp1) minus the polarization observed during read of a binary zero (dp0). Similar curves for various ferroelectric materials can be empirically derived by measuring the remanent polarization after each thermal cycle using techniques known to those with skill in the art. In this fashion, the stabilization curve for a given ferroelectric material and given operating temperature can be derived and the thermal cycles for stabilization determined.

A second functional test is performed after completion of thermal cycling in step 112. Greater than 90% of the failures will be detected after the thermal cycles. A final screening for additional imprint failures is done in step 114. Step 114 is performed in a similar fashion to step 52. In one embodiment, the device is written into the opposite state as it was during the thermal cycling 110 and the part is baked for five minutes at a temperature of 80° C. Higher temperatures may be used depending upon the particular ferroelectric material and device operating temperature. The device is written into the opposite state as it was during the thermal cycling 110. Parts remaining after completion of step 114 have satisfactorily completed the screening process and can be shipped to customers.

Note that the thermal cycling screening process results in a part that can be sold for use in higher operating temperatures. The part is thus available for more numerous and rigorous applications and is thus more commercially valuable. In addition, the thermal and mechanical screening processes reduce the possibility that the part will undergo a further contraction of the hysteresis causing a failure in the field. For this reason, the thermally and mechanically cycled parts are shipped with a higher degree of confidence in their reliability than those parts shipped using the FIG. 4 screening procedures.

A preferred embodiment of the invention has been described. Variations and modifications will be readily apparent to those of ordinary skill in the art. For example, although the present invention has been described using barium titanate and lead zirconate titanate as examples, the present invention also applies to other ferroelectric materials not mentioned herein. In addition, the thermal screening process of the present invention may be used for thermal stabilization of devices, other than memories, that incorporate ferroelectric materials. For this reason, the invention should be construed in light of the claims.

WHAT IS CLAIMED IS:

1. A method for screening a ferroelectric device comprising the steps of:
   (a) poling the ferroelectric device;
   (b) heating the ferroelectric device to an elevated temperature, said elevated temperature greater than room temperature and less than a Curie temperature of the ferroelectric device;
   (c) maintaining said elevated temperature for a given duration;
   (d) cooling the ferroelectric device to a second temperature less than said elevated temperature; and
   (e) repeating steps (b)–(d) inclusive, wherein steps (b)–(d) are performed at least a total of two times.

2. The method of screening of claim 1, wherein the elevated temperature is between 10° C. and 25° C., inclusive, above a maximum operating temperature of the ferroelectric device.

3. The method of screening of claim 1, wherein the step of repeating steps (b)–(d) comprises the step of repeating steps (b)–(d) between two and five times, inclusive.

4. The method of screening of claim 1, wherein said second temperature is approximately equal to room temperature.

5. The method of screening of claim 1, wherein said given duration is equal to approximately 500 seconds.

6. In a ferroelectric memory device having a plurality of storage cells and a plurality of ferroelectric capacitors, a method for screening a ferroelectric memory device comprising the steps of:
   (a) poling said plurality of ferroelectric capacitors wherein each of said ferroelectric capacitors has a given polarity comprising one of a first or second polarity;
   (b) cycling a temperature of the ferroelectric device between a first temperature and an elevated temperature when the ferroelectric plurality capacitors have said given polarity, wherein said elevated temperature is less than a Curie temperature of the ferroelectric device and greater than a maximum operating temperature of the ferroelectric device.

7. The method of screening of claim 6, further comprising the step of cycling the given polarity between said first polarity and said second polarity.

8. The method of screening of claim 6, wherein step (b) comprises between three to five cycles, inclusive.

9. The method of screening of claim 6, wherein said first temperature is approximately equal to room temperature.

10. The method of screening of claim 6, wherein step (b) further comprises the step of maintaining said elevated temperature for a period of less than approximately 600 seconds.

11. The method of screening of claim 7, wherein the step of cycling comprises between 100 to $10^5$ cycles, inclusive.

12. In a ferroelectric memory device having a plurality of storage cells and a plurality of ferroelectric capacitors, a method for screening a ferroelectric memory device comprising the steps of:
(a) measuring a remanent polarization of the ferroelectric capacitors;
(b) cycling a polarity of the ferroelectric capacitors between a first polarity and a second polarity;
(c) writing data into said plurality of storage cells;
(d) reading said data from said plurality of storage cells;
(e) repeating steps (c) and (d);
(f) cycling a temperature of the ferroelectric capacitors between a first temperature and an elevated temperature, wherein said elevated temperature is less than a Curie temperature of the ferroelectric capacitor and greater than a maximum operating temperature of the ferroelectric memory device; and
(g) performing an imprint bake of the ferroelectric memory device.

13. The method of screening of claim 12, further comprising the step of repeating steps (a)–(g), inclusive.

14. The method of screening of claim 12, wherein step (b) comprises between 100 to $10^5$ cycles, inclusive.

15. The method of screening of claim 12, wherein step (e) further comprises the steps of repeating steps (c) and (d) between approximately $10^3$ and $10^5$ times.

16. The method of screening of claim 12, wherein step (f) comprises between three to six cycles, inclusive.

17. The method of screening of claim 12, wherein said first temperature is approximately equal to room temperature.

18. The method of screening of claim 12, wherein said elevated temperature is approximately equal to 80° C.

19. The method of screening of claim 12, wherein said elevated temperature is approximately equal to 150° C.

20. The method of screening of claim 12, further comprising the step of maintaining said elevated temperature for a period of approximately less than 600 seconds.

21. The method of screening of claim 12, wherein step (g) further comprises the steps of:
writing data to said plurality of cells;
baking said memory device at a second elevated temperature for a predetermined duration; and
verifying the data written to the plurality of cells.

22. The method of screening of claim 21, wherein said second elevated temperature is approximately equal to 80° C.

23. The method of screening of claim 21, wherein said predetermined duration is approximately equal to 8 hours.

24. The method of screening of claim 21, wherein said predetermined duration is approximately equal to five minutes.

25. In a ferroelectric memory device having a plurality of storage cells and a plurality of ferroelectric capacitors, a method for screening a ferroelectric memory device comprising the steps of:
(a) cycling a polarity of the ferroelectric capacitors between a first polarity and a second polarity;
(b) performing an imprint bake of the ferroelectric memory devices; and
(c) repeating step (a) and step (b).

* * * * *